(12) United States Patent
Li et al.

(10) Patent No.: US 11,114,414 B2
(45) Date of Patent: Sep. 7, 2021

(54) WAFER STRUCTURE WITH CAPACITIVE CHIP INTERCONNECTION, METHOD FOR MANUFACTURING THE SAME, AND CHIP STRUCTURE WITH CAPACITIVE CHIP INTERCONNECTION

(71) Applicant: Wuhan Xinxin Semiconductor Manufacturing Co., Ltd., Hubei (CN)

(72) Inventors: Yang Li, Hubei (CN); Sheng Hu, Hubei (CN)

(73) Assignee: Wuhan Xinxin Semiconductor Manufacturing Co., Ltd., Hubei (CN)

( * ) Notice: Subject to any disclaimer, the term of this patent is extended or adjusted under 35 U.S.C. 154(b) by 61 days.

(21) Appl. No.: 16/582,620

(22) Filed: Sep. 25, 2019

(65) Prior Publication Data

US 2021/0028151 A1 Jan. 28, 2021

(30) Foreign Application Priority Data

Jul. 25, 2019 (CN) .......................... 201910677112.3

(51) Int. Cl.
*H01L 25/065* (2006.01)
*H01L 21/78* (2006.01)
(Continued)

(52) U.S. Cl.
CPC .......... *H01L 25/0657* (2013.01); *H01L 21/78* (2013.01); *H01L 23/528* (2013.01);
(Continued)

(58) Field of Classification Search
CPC ..... H01L 25/0657; H01L 24/08; H01L 24/83; H01L 25/50; H01L 21/78; H01L 23/5226;
(Continued)

(56) References Cited

U.S. PATENT DOCUMENTS

| | | | |
|---|---|---|---|
| 7,781,879 B1 * | 8/2010 | Rahman | H01L 25/0657 257/686 |
| 10,431,565 B1 * | 10/2019 | Kim | H01L 25/50 |

(Continued)

FOREIGN PATENT DOCUMENTS

| | | |
|---|---|---|
| CN | 107240593 A | 10/2017 |
| CN | 108336071 A | 7/2018 |

OTHER PUBLICATIONS

First Chinese Office Action regarding Application No. 201910677112.3 dated Nov. 25, 2019. English translation provided by Unitalen Attorneys at Law.

*Primary Examiner* — Quoc D Hoang
(74) *Attorney, Agent, or Firm* — Harness, Dickey & Pierce, P.L.C.

(57) ABSTRACT

A wafer structure, a method for manufacturing the same and a chip structure are provided. A first capacitor plate is arranged in a first chip, a second capacitor plate is arranged in a second chip, and the first chip is stacked together via bonding layers with the second chip with a front surface of the first chip facing toward a front surface of the second chip. In this way, a capacitor structure formed by the first capacitor plate, the second capacitor plate and dielectric materials provided therebetween is formed while bonding the first chip and second chip together, and the capacitor plate and the dielectric materials may be formed while forming a device interconnection structure in the chip, such that no additional process is required, thereby improving device integration and process integration.

14 Claims, 6 Drawing Sheets

(51) Int. Cl.
  *H01L 23/522* (2006.01)
  *H01L 23/528* (2006.01)
  *H01L 23/00* (2006.01)
  *H01L 25/00* (2006.01)
  *H01L 49/02* (2006.01)

(52) U.S. Cl.
  CPC .......... *H01L 23/5226* (2013.01); *H01L 24/08* (2013.01); *H01L 24/32* (2013.01); *H01L 24/83* (2013.01); *H01L 24/89* (2013.01); *H01L 24/94* (2013.01); *H01L 25/50* (2013.01); *H01L 28/60* (2013.01); *H01L 24/29* (2013.01); *H01L 2224/0557* (2013.01); *H01L 2224/08147* (2013.01); *H01L 2224/29187* (2013.01); *H01L 2224/32145* (2013.01); *H01L 2224/80895* (2013.01); *H01L 2224/80896* (2013.01); *H01L 2224/83896* (2013.01); *H01L 2225/06531* (2013.01); *H01L 2225/06548* (2013.01); *H01L 2924/04642* (2013.01); *H01L 2924/05042* (2013.01); *H01L 2924/05442* (2013.01)

(58) Field of Classification Search
  CPC ....... H01L 23/528; H01L 24/32; H01L 24/89; H01L 24/94
  See application file for complete search history.

(56) References Cited

U.S. PATENT DOCUMENTS

| | | |
|---|---|---|
| 2010/0238334 A1 | 9/2010 | Takahashi |
| 2019/0115323 A1* | 4/2019 | Haba .................. H01L 25/0657 |

\* cited by examiner

WAFER STRUCTURE WITH CAPACITIVE CHIP INTERCONNECTION, METHOD FOR MANUFACTURING THE SAME, AND CHIP STRUCTURE WITH CAPACITIVE CHIP INTERCONNECTION

The present disclosure claims the priority to Chinese Patent Application No. 201910677112.3, titled "WAFER STRUCTURE, METHOD FOR MANUFACTURING THE SAME, AND CHIP STRUCTURE", filed on Jul. 25, 2019 with the Chinese Patent Office, which is incorporated herein by reference in its entity.

FIELD

The present disclosure relates to the technical field of semiconductor devices and methods for manufacturing the same, and in particular to a wafer structure, a method for manufacturing the same, and chip structure.

BACKGROUND

With the continuous development of semiconductor technologies, integrated circuits have been widely used in many electronic devices. In some applications, the integrated circuit includes both an active device such as a transistor and a passive device such as a capacitor. However, with an increased demand for a high integration, high requirements are imposed to the chip designing and manufacturing processes.

SUMMARY

In view of the above, a wafer structure, a method for manufacturing the same, and a chip structure are provided according to the present disclosure, to improve device integration and process integration.

A chip structure is provided according to an embodiment of the present disclosure, which includes a first chip and a second chip. The first chip includes a first substrate, a first cover layer of a first dielectric material on a front surface of the first substrate, a first capacitor plate and a first plate interconnection structure electrically connected to the first capacitor plate that are arranged in the first cover layer, and a first bonding layer of a second dielectric material on the first cover layer. The second chip includes a second substrate, a second cover layer of a third dielectric material on a front surface of the second substrate, a second capacitor plate and a second plate interconnection structure electrically connected to the second capacitor plate that are arranged in the second cover layer, and a second bonding layer of a fourth dielectric material on the second cover layer. The first chip is stacked with the second chip via the first bonding layer and the second bonding layer with a front surface of the first chip facing toward a front surface of the second chip, and the first capacitor plate is arranged facing toward the second capacitor plate with at least at least the second dielectric material and the fourth dielectric material being provided between the first capacitor plate and the second capacitor plate.

In an embodiment, the first capacitor plate is arranged in a top wiring layer in the first chip, and the second capacitor plate is arranged in a top wiring layer in the second chip.

In an embodiment, the first plate interconnection structure includes a first contact plug on the first substrate, and the first contact plug is connected to a lower surface of the first capacitor plate. Alternatively, the first plate interconnection structure includes an interconnection layer connected to the lower surface of the first capacitor plate.

In an embodiment, the second plate interconnection structure includes a second contact plug on the second substrate, and the second contact plug is connected to a lower surface of the second capacitor plate. Alternatively, the second plate interconnection structure includes an interconnection layer connected to the lower surface of the second capacitor plate.

In an embodiment, the first bonding layer is arranged with a bonding pad to lead out the interconnection layer of the first device interconnection structure, and the second bonding layer is arranged with a bonding pad to lead out the interconnection layer of the second device interconnection structure, and wherein the bonding pad of the first bonding layer is aligned with the bonding pad of the second bonding pad.

A wafer structure is further provided according to an embodiment of the present disclosure, which includes a wafer bonding structure. The wafer bonding structure includes a first wafer and a second wafer which are stacked with each other with a front surface of the first wafer facing toward a front surface of the second wafer, and the wafer bonding structure further includes multiple above-described chip structures arranged in an array.

A method for manufacturing a wafer structure is further provided according to an embodiment of the present disclosure, which includes:

providing a first wafer, where the first wafer is provided with first chips arranged in an array, and each of the first chips includes a first substrate, a first cover layer of a first dielectric material on a front surface of the first substrate, a first capacitor plate and a first plate interconnection structure electrically connected to the first capacitor plate that are arranged in the first cover layer, and a first bonding layer of a second dielectric material on the first cover layer;

providing a second wafer, where the second wafer is provided with second chips arranged in an array, and each of the second chips includes a second substrate, a second cover layer of a third dielectric material on a front surface of the second substrate, a second capacitor plate and a second plate interconnection structure electrically connected to the second capacitor plate that are arranged in the second cover layer, and a second bonding layer of a fourth dielectric material on the second cover layer; and bonding the first wafer and the second wafer together via the first bonding layer and the second bonding layer, to obtain a wafer bonding structure in which the first wafer is stacked with the second wafer with a front surface of the first wafer facing toward a front surface of the second wafer, where the first capacitor plate is arranged facing toward the second capacitor plate with at least at least the second dielectric material and the fourth dielectric material being provided between the first capacitor plate and the second capacitor plate.

In an embodiment, the first capacitor plate is arranged in a top wiring layer in the first chip, and the second capacitor plate is arranged in a top wiring layer in the second chip.

In an embodiment, the method further includes:
cutting the wafer bonding structure, to obtain separate chip structures.

With the wafer structure, the method for manufacturing the same and the chip structure according to the embodiments of the present disclosure, a first capacitor plate is arranged in a first chip, a second capacitor plate is arranged in a second chip, and the first chip is stacked together via bonding layers with the second chip with a front surface of the first chip facing toward a front surface of the second chip. In this way, a capacitor structure formed by the first capacitor plate, the second capacitor plate and the dielectric materials provided therebetween is formed while bonding the first chip and second chip together. The capacitor plate and the dielectric material may be formed while forming a device interconnection structure in the chip, such that no additional process is required, thereby improving device integration and process integration.

BRIEF DESCRIPTION OF THE DRAWINGS

In order to more clearly illustrate technical solutions in embodiments of the present disclosure or in the conventional technology, the drawings to be used in the description of the embodiments or the conventional technology are briefly described below. Apparently, the drawings in the following description show only some embodiments of the present disclosure, and other drawings may be obtained by those skilled in the art from the drawings without any creative work.

DETAILED DESCRIPTION

In order to make the above objects, features and advantages become apparent, embodiments of the present disclosure are described below in detail with reference to the drawings.

Multiple details are described in the following descriptions, so as to fully understand the present disclosure. However, the present disclosure may be implemented by other ways different from the way described herein. Similar promotions can be made by those skilled in the art without departing from the spirit of the present disclosure. Therefore, the present disclosure is not limited to the specific embodiments described in the following.

The present disclosure is described in detail with reference to the schematic diagrams. For convenience of description, sectional views showing structures of devices may be partially enlarged not based on a general proportion. The schematic diagrams are merely exemplary, and the protection scope of the present disclosure is not limited hereto. Further, three-dimensional dimension including a length, a width and a depth should be included in practice.

Figure 1:
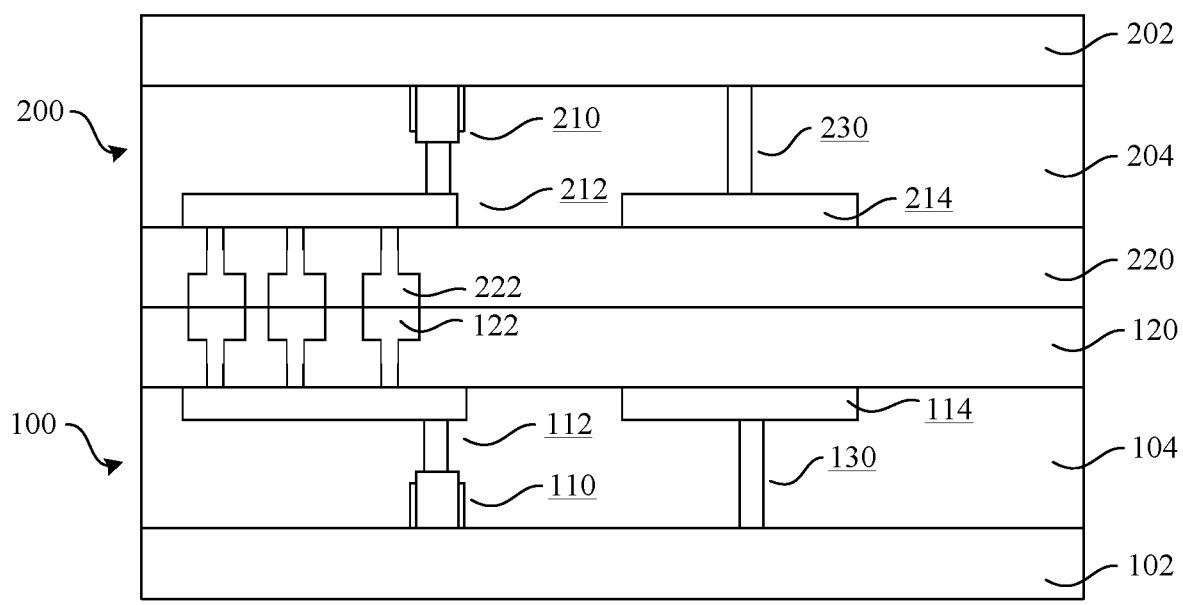
FIG. 1 is a schematic cross-sectional view of a chip structure according to an embodiment of the present disclosure.
Figure 2:
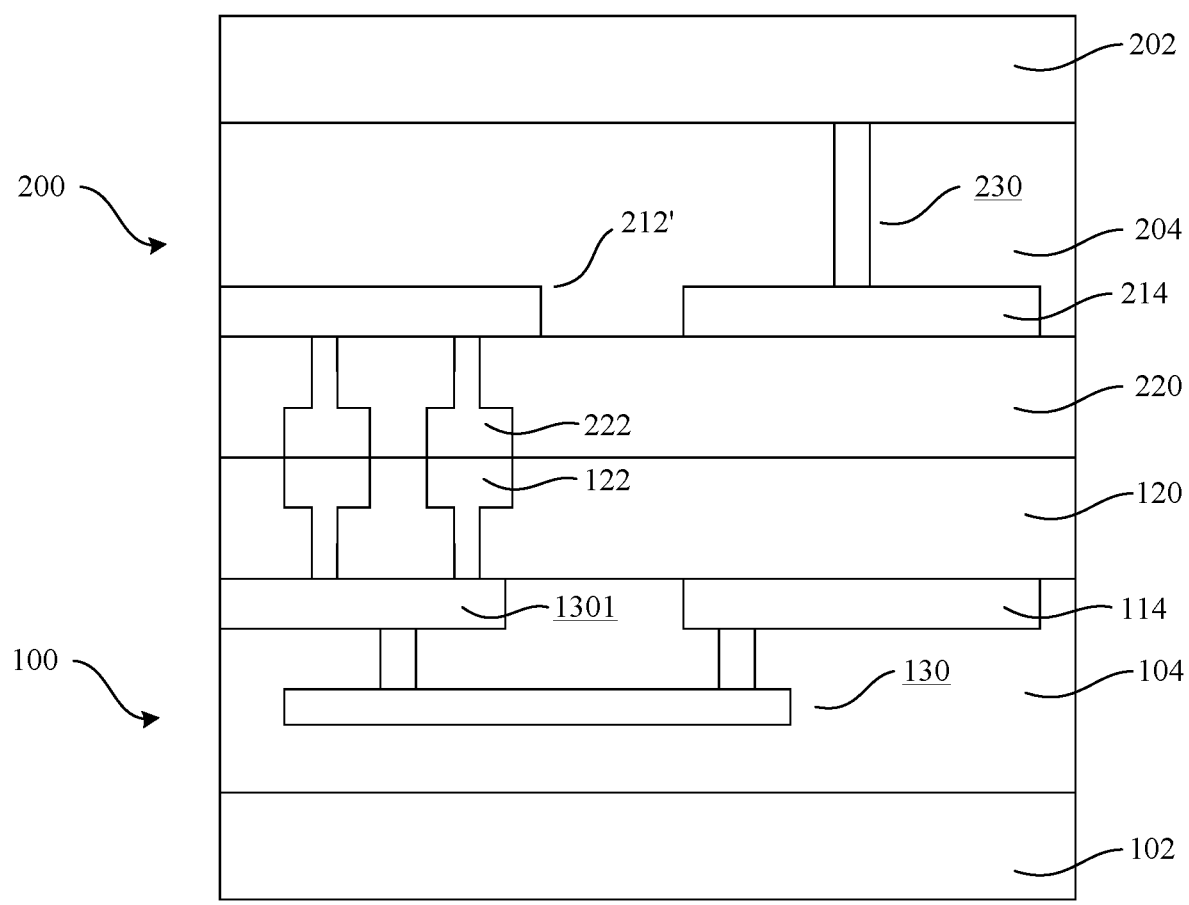
FIG. 2 is a schematic cross-sectional view of a chip structure according to another embodiment of the present disclosure.
Figure 3:
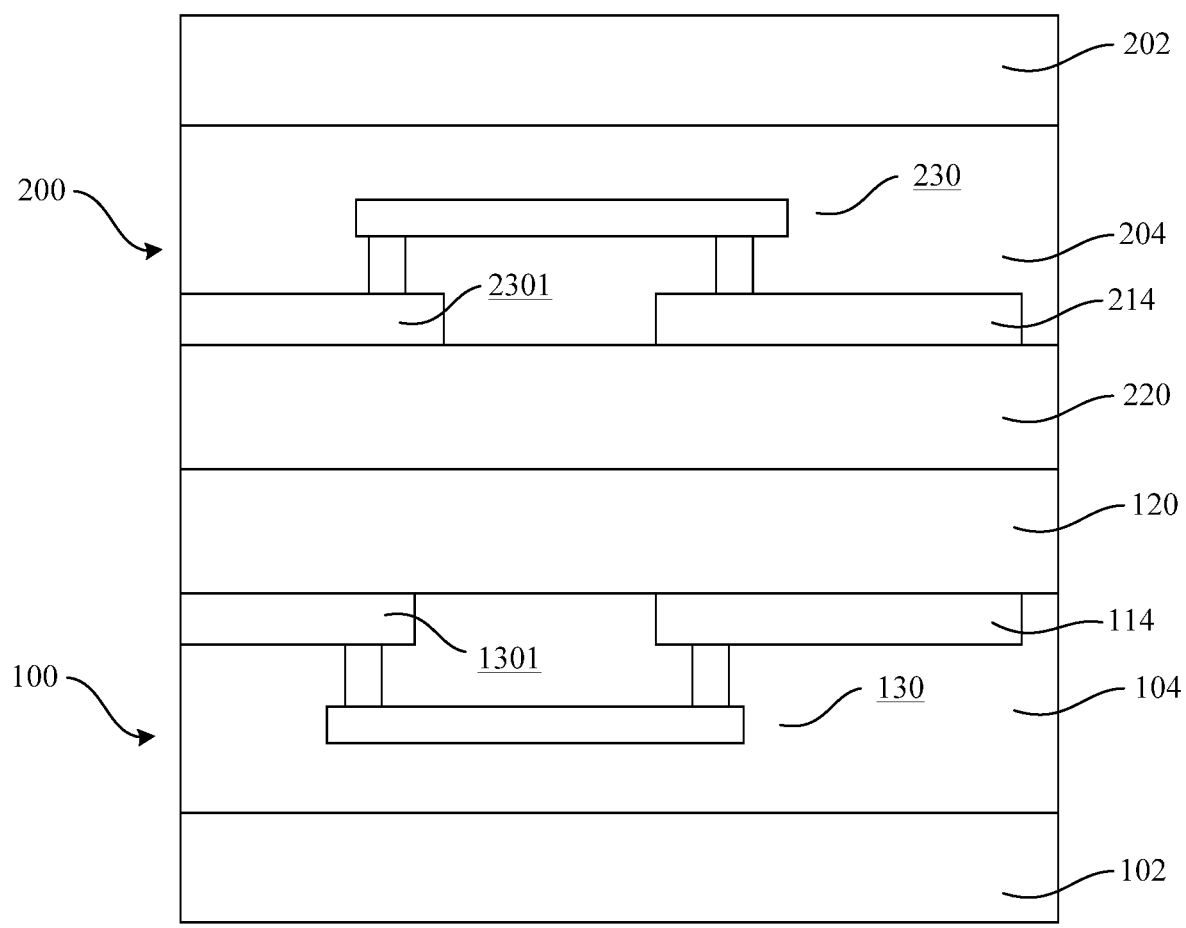
FIG. 3 is a schematic cross-sectional view of a chip structure according to another embodiment of the present disclosure.

Referring to FIGS. 1 to 3, a chip structure is provided according to an embodiment of the present disclosure. The chip structure includes a first chip 100 and a second chip 200. The first chip 100 includes a first substrate 102, a first cover layer 104 of a first dielectric material on a front surface of the first substrate 102, a first capacitor plate 114 and a first plate interconnection structure 130 electrically connected to the first capacitor plate 114 that are arranged in the first cover layer 104, and a first bonding layer 120 of a second dielectric material on the first cover layer on the first cover layer 104. The second chip 200 includes a second substrate 202, a second cover layer 204 of a third dielectric material on a front surface of the second substrate 202, a second capacitor plate 214 and a second plate interconnection structure 230 electrically connected to the second capacitor plate 214 that are arranged in the second cover layer 204, and a second bonding layer 220 of a fourth dielectric material on the second cover layer 204. The first chip 100 is stacked with the second chip 200 via the first bonding layer 120 and the second bonding layer 220 with a front surface of the first chip 100 facing toward a front surface of the second chip 200, and the first capacitor plate 114 is arranged facing toward the second capacitor plate 214 with at least the second dielectric material and the fourth dielectric material being provided between the first capacitor plate 114 and the second capacitor plate 214.

In the embodiment of the present disclosure, each of the first chip 100 and the second chip 200 may be arranged with a device structure and an interconnection structure electrically connected to the device structure. The device structure is arranged on the substrate. The device structure may include a metal oxide semiconductor (MOS) device, a storage device and/or other passive devices except a capacitor. The storage device may include a nonvolatile memory, a random-access memory or the like. The nonvolatile memory may include a ferroelectric memory, a phase change memory, or a floating gate field-effect transistor such as an NOR flash memory, a NAND flash memory. The device structure may be a planar device or a three-dimensional device. The three-dimensional device may be, for example, a fin field-effect transistor (FIN-FET), a three-dimensional memory or the like. The sensor device may be, for example, a photosensitive device or the like. Other passive devices include a resistor, an inductor, or the like.

The device structure may be covered by a cover layer made of a dielectric material. The cover layer may be of a lamination structure, and may include an interlayer dielectric layer, an intermetallic dielectric layer and the like. An interconnection structure of the device structure and a plate interconnection structure of a capacitor plate may be arranged in the cover layer. The interconnection structure of the device structure may include a contact plug, a via hole and a wiring layer. The wiring layer may include one or more layers. The interconnection structure may be made of a metal material, for example, tungsten, aluminum and copper. The plate interconnection structure of the capacitor plate may have a different structure from the interconnection structure of the device structure. The plate interconnection structure of the capacitor plate may include only one or several layers in the interconnection structure of the device structure. Alternatively, the plate interconnection structure of the capacitor plate may have a completely different structure from the interconnection structure of the device structure. The substrate may be a semiconductor substrate, for example, a Si substrate, a Ge substrate, a SiGe substrate, a silicon on insulator (SOI) substrate, or a germanium on insulator (GOI) substrate.

In some embodiments, as shown in FIG. 1, the first chip 100 may include a first substrate 102, a first cover layer 104 on the first substrate 102, a first device structure 110 and a first device interconnection structure 112 electrically connected to the first device structure 110 that are arranged in the first cover layer 104, and a first capacitor plate 114 and a first plate interconnection structure 130 electrically connected to the first capacitor plate 114 that are arranged in the first cover layer 104.

The second chip 200 may include a second substrate 202, a second cover layer 204 on the second substrate 202, a second device structure 210 and a second device interconnection structure 212 electrically connected to the second device structure 210 that are arranged in the second cover layer 204, a second capacitor plate 214 and a second plate interconnection structure 230 electrically connected to the second capacitor plate 214 that are arranged in the second cover layer 204.

In an embodiment of the present disclosure, each chip may include one or more different device structures, each chip may have the same or completely different device structures. The different device structures may be devices of different types or devices of the same type that have different operating voltages. In an example, the first device structure may include a memory device, and the second device structure may include a MOS device. In another example, the first device structure may include a MOS device, and the second device structure may include a sensor device.

It should be noted that, the drawings corresponding to the embodiments of the present disclosure are only illustrative, and device structures, interconnection structures and electrical connections are not specifically shown in each chip. In addition, for convenience of description, two surfaces of a chip are respectively referred to as a front surface of the chip and a back surface of the chip. The front surface of the chip is a surface toward a surface of the substrate on which a device and an interconnection structure are arranged, and a back surface of the chip is a surface opposite to the front surface, that is, a back surface of the substrate. The expression of forming or arranging on or under a structure is described by taking the front surface of the chip as a reference.

A first bonding layer 120 is formed on the front surface of the first chip 100, and a second bonding layer 220 is formed on the front surface of the second chip 200. The first chip 100 and the second chip 200 are bonded together via the first bonding layer 120 and the second bonding layer 220, and a bonding interface is formed between the two bonding layers. Each of the first bonding layer 120 and the second bonding layer 220 is made of a bonding dielectric material, and may be of a single-layer structure or a lamination structure. The first bonding layer 120 and the second bonding layer 220 may be formed with the same or different materials, which may include, for example, one or more of bonding dielectric materials such as silicon oxide, silicon nitride or nitrogen doped silicon carbide (NDC).

In the embodiment of the present disclosure, in the first chip 100, only the second dielectric material is provided on the first capacitor plate 114, and in the second chip 200, only the fourth dielectric material is provided on the second capacitor plate 214. In this way, in a case that the first chip 100 and the second chip 200 are bonded together via the first bonding layer 120 and the second bonding layer 220, only the second dielectric material and the fourth dielectric material is provided between the first capacitor plate 114 and the second capacitor plate 214, such that a capacitor structure is formed by the first capacitor plate 114, the second capacitor plate 214 and the second dielectric material and the fourth dielectric material therebetween.

In the embodiment of the present disclosure, the first capacitor plate 114 may be formed together with a wiring layer of the first device structure 110 in the first chip 100 and may be made of the same material as the wiring layer, for example, a metal material such as copper or aluminum. The second capacitor plate 214 may be formed together with a wiring layer of the second device structure 210 in the second chip 200, and may be made of the same material as the wiring layer, for example, a metal material such as copper or aluminum.

In some embodiments, the first capacitor plate 114 may be arranged in a top wiring layer in the first chip 100, that is, there is no other wiring layer on the first chip on the first capacitor plate 114. The first capacitor plate 114 may be formed together with a top wiring layer of the first device interconnection structure 112 of the first device structure 110, such that only the first bonding layer 120 of the second dielectric material is arranged on the first capacitor plate 114. The second capacitor plate 214 may be arranged in a top wiring layer of the second chip 200, that is, there is no other wiring layer on the second capacitor plate 214. The second capacitor plate 214 may be formed together with a top wiring layer of the second device interconnection structure 212 of the second device structure 210, such that only includes the second bonding layer 220 of the fourth dielectric material is arranged on the second capacitor plate 214. In this embodiment, a capacitor with a desired capacitance may be formed by controlling the materials and thicknesses of the first bonding layer 120 and the second bonding layer 220.

In some applications of the above embodiment, the first chip and the second chip may be bonded together only via the first bonding layer 120 and the second bonding layer 220. In other applications, the first bonding layer 120 may be arranged with a first bonding pad 122 and the second bonding layer 220 may be arranged with a second bonding pad 222. The first bonding pad 122 and the second bonding pad 222 may be made of a bonding conductive material such as copper. Each of the first bonding pad 122 and the second bonding pad 222 extends to the top wiring layer of the interconnection structure in the corresponding chip, and leads the interconnection structure out. In the bonding process, the first bonding pad 122 is aligned with the second bonding pad 222, to realize hybrid bonding of the dielectric material and the metal material. In these applications, in a case that the first capacitor plate 114 and the second capacitor plate 214 are arranged in the top layers, the capacitor structure may be formed in a blank region outside the bonding pads without occupying any additional chip area, which facilitates formation of a capacitor structure with a larger area while increasing device integration.

In other embodiments, the first capacitor plate 114 may also be arranged in another wiring layer below the top wiring layer in the first chip. The first capacitor plate 114 may be formed together with a non-top wiring layer of the first device interconnection structure 212 in the first device structure 110, such that the first bonding layer 120 of the second dielectric material and a part of the first cover layer 104 of the first dielectric material are arranged on the first capacitor plate 114. The second capacitor plate 214 may also be arranged in another wiring layer below the top wiring layer in the second chip. The second capacitor plate 214 may be formed together with a non-top wiring layer of the second device interconnection structure 212 in the second device structure 210, such that the second bonding layer 220 of the fourth dielectric material and a part of the second cover layer 204 of the third dielectric material are arranged on the second capacitor plate 214.

In the embodiment of the present disclosure, the first capacitor plate 114 is electrically connected to the first plate interconnection structure 130, and the second capacitor plate 214 is electrically connected to the second plate interconnection structure 230. Each of the first plate interconnection structure 130 and the second plate interconnection structure 230 may be used to directly lead the respective plate out. Alternatively, each of the first plate interconnection structure 130 and the second plate interconnection structure 230 may be used to further connect with another interconnection structure, for example, the interconnection structure of the device structure.

In some embodiments, as shown in FIG. 1, the first plate interconnection structure 130 may include a first contact plug on the first substrate 102, and the first contact plug is connected to a lower surface of the first capacitor plate 114. According to actual needs, the first contact plug may be directly connected to the lower surface of the first capacitor plate 114, or may be connected to the lower surface of the first capacitor plate 114 through an interconnection layer. A via hole may be formed at the back surface of the first substrate 102, to lead the first capacitor plate 114 out through the first contact plug. Alternatively, the first substrate 102 may be directly used as an electrical leading-out structure for the first capacitor plate 114.

In some embodiments, as shown in FIGS. 1 and 2, the second plate interconnection structure 230 may include a second contact plug on the second substrate 202, and the second contact plug is connected to a lower surface of the second capacitor plate 214. According to actual needs, the second contact plug may be directly connected to the lower surface of the second capacitor plate 214, or may be connected to the lower surface of the second capacitor plate 214 through an interconnection layer. A via hole may be formed at the back surface of the second substrate 202, to lead the second capacitor plate 214 out through the second contact plug. Alternatively, the second substrate 202 may be directly used as an electrical leading-out structure for the second capacitor plate 214.

In other embodiments, as shown in FIGS. 2 and 3, the first plate interconnection structure 130 may include a first interconnection layer connected to the lower surface of the first capacitor plate 114, and the first interconnection layer may be of a multi-layer structure, and may include a wiring layer and a via hole connected thereto.

In some applications, as shown in FIG. 2, the first interconnection layer may be directly used for leading-out the first plate interconnection structure 130, and the first interconnection layer may include an interconnection layer connecting to the lower surface of the first capacitor plate 114 and a top wiring layer 1301 connected thereto. The first capacitor plate 114 may be led-out by the top wiring layer 1301. The second interconnection layer may also be used directly for leading-out the second plate interconnection structure 230, and the second plate interconnection structure may include an interconnection layer connected to the lower surface of the second capacitor plate 214 and a top wiring layer connected thereto. The second capacitor plate may be led-out by the top wiring layer.

In a specific embodiment, a first bonding pad 122 may be formed in the first bonding layer 120, and a second bonding pad 222 may be formed in the second bonding layer 220, and the first interconnection layer may be led-out by the first bonding pad 122, and the second interconnection layer may be led-out by the second bonding pad 222.

In a specific application, the first bonding pad 122 that is contacted with the top wiring layer 1301 may be arranged in the first bonding layer 120, and another interconnection structure 212' for leading-out is arranged accordingly in the second chip 200. The interconnection structure 212' for leading-out is provided with a second bonding pad 222 contacted therewith. The second bonding pad 222 is arranged in the second bonding layer 220. In a case that the bonding is performed after aligning the first bonding pad 122 and the second bonding pad 222, a via hole contacted with the interconnection structure 212' for leading-out may be formed at a back surface of the second substrate 202, to lead the first capacitor plate 114 out.

In other applications, as shown in FIG. 3, the first interconnection layer may include an interconnection layer connected to the lower surface of the first capacitor plate 114, which may be interconnected with the first device interconnection structure (not shown in FIG. 3). In a specific example, the interconnection layer may include an interconnection layer connected to the lower surface of the first capacitor plate 114 and the top wiring layer 1301 connected thereto. In addition, the second interconnection structure may also include an interconnection layer connected to the lower surface of the second capacitor plate 214, which may be interconnected with the second device interconnection structure (not shown in FIG. 3). In a specific example, the interconnection layer may include an interconnection layer connected to the lower surface of the second capacitor plate 214 and a top wiring layer 2301 connected thereto. In a specific application, the first device interconnection structure and the second device interconnection structure which are connected to respective capacitor plates may be led out through via holes formed on the back surfaces of the substrates. The via hole may be formed in the interconnection layer of the device structure. Alternatively, the via hole may also be formed in the plate interconnection layer.

The chip structure according to the embodiment of the present disclosure is described in detail above. In addition, a wafer structure is further provided according to an embodiment of the present disclosure, which includes a wafer bonding structure. The wafer bonding structure includes a first wafer and a second wafer which are stacked with each other with a front surface of the first wafer facing toward a front surface of the second wafer. The wafer bonding structure is provided with multiple chip structures arranged in an array. As shown in FIG. 4 and FIGS. 1 to 3, FIG. 4 is a schematic top view of a wafer in the wafer bonding structure. The first chips 100 are arranged in an array on the first wafer 1000, and the second chips 200 are arranged in an array on the second wafer 2000. In a case that the first wafer 1000 and the second wafer 2000 are bonded together to form the wafer bonding structure, the formed wafer bonding structure also includes the chip structures arranged in an array.

In addition, a method for manufacturing the wafer structure and the chip structure described above is further provided according to the present disclosure, which is described in detail below with reference to the drawings.

Figure 4:
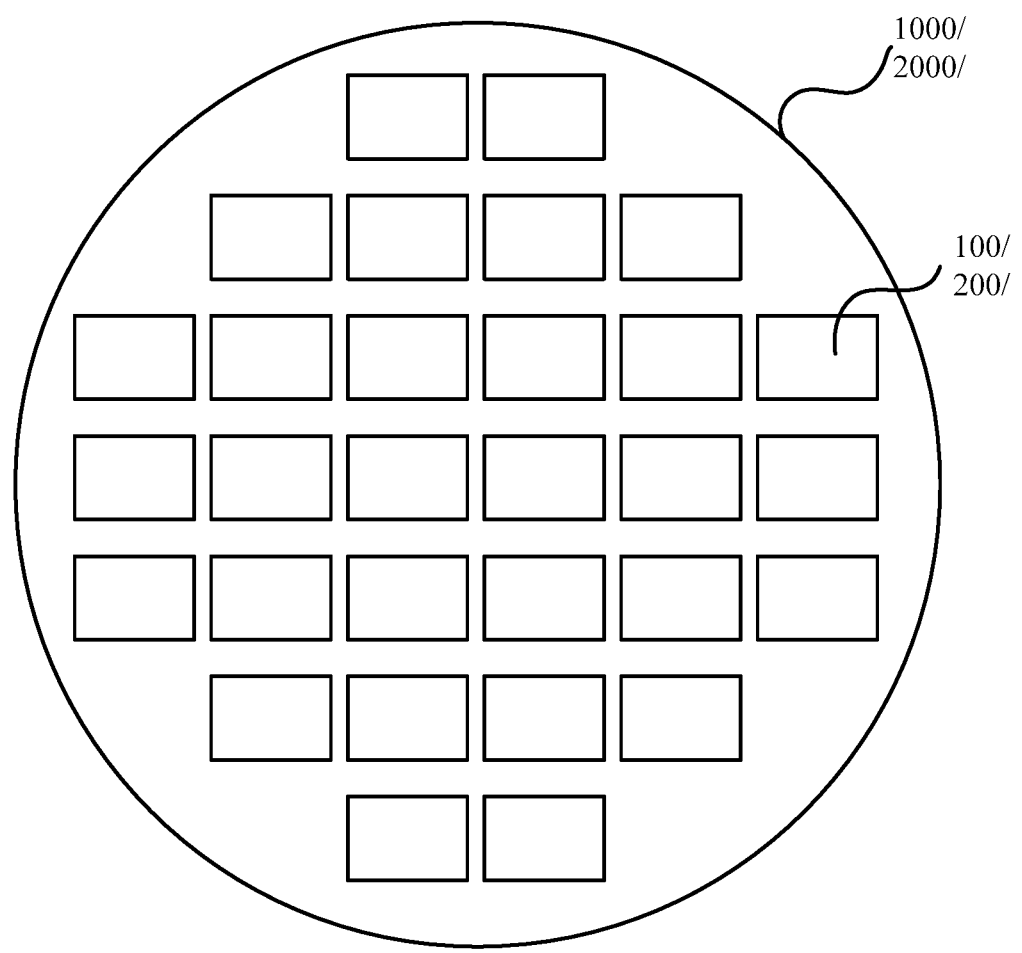
FIG. 4 is a schematic top view of a wafer in a wafer structure according to an embodiment of the present disclosure.
Figure 5:
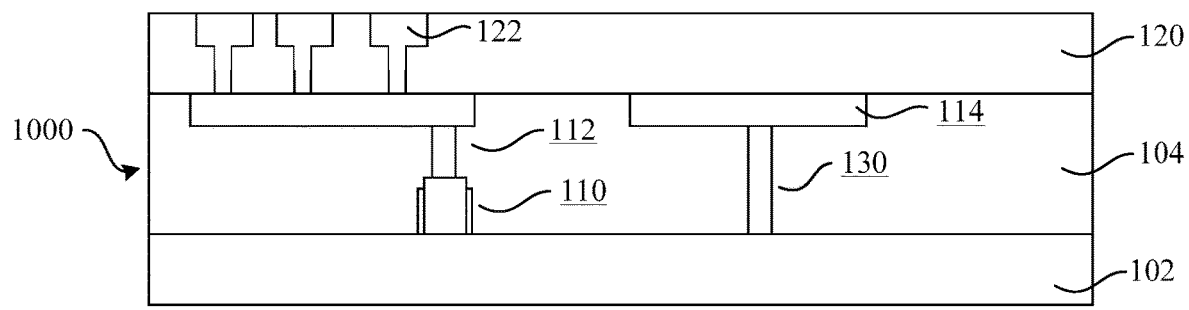
FIGS. 5 to 7 are schematic partial cross-sectional views of structures formed in respective process for forming a wafer structure with a method for manufacturing a wafer structure according to an embodiment of the present disclosure.

In step S01, a first wafer 1000 is provided. The first wafer 1000 includes first chips 100 arranged in an array. The first chip 100 includes a first substrate 102, a first cover layer of a first dielectric material 104 on a front surface of the first substrate 102, a first capacitor plate 114 and a first plate interconnection structure 130 electrically connected to the first capacitor plate 114 that are arranged in the first cover layer 104, and a first bonding layer 120 of a second dielectric material on the first cover layer 104, as shown in FIGS. 4 and 5.

In the embodiment, all the device processing processes before forming a bonding layer are performed on the first wafer 1000. As shown in FIG. 5, a first device structure 110, a first device interconnection structure 112 of the first device structure 110, a first capacitor plate 114 and a first plate interconnection structure 130 of the first capacitor plate 114 are already formed on the first substrate 102 of the first wafer 1000, which are covered by the first cover layer 104 of the first dielectric material. The first device interconnection structure 112 and the first plate interconnection structure 130 may or may not be electrically connected with each other. The first plate interconnection structure 130 may be formed together with the first device interconnection structure 112, and may have partially or completely the same structure as the first device interconnection structure 112. The first capacitor plate 114 may be formed together with a top wiring layer in the first device interconnection structure 112, such that no interconnection structure is formed on the first capacitor plate 114. In this example, the first capacitor plate 114 may be arranged in a top wiring layer, and is formed together with the top wiring layer of the first device interconnection structure 112.

The first bonding layer 120 of the second dielectric material on the first cover layer 104 is used for bonding the wafers together. According to actual needs, a first bonding pad 122 may be formed in the first bonding layer 120, to electrically connect to the top wiring layer. Further, the first bonding pad 122 may be aligned with a bonding pad in another wafer, to form a wafer structure in a hybrid bonding manner.

Figure 6:
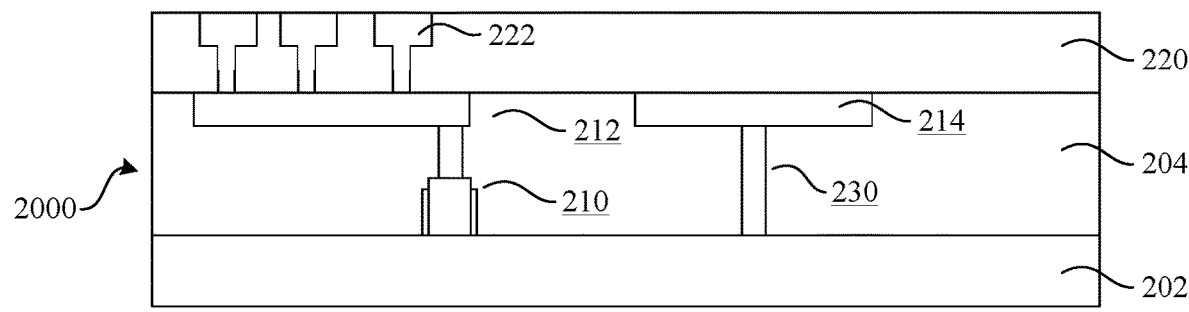

In step S02, a second wafer 2000 is provided, the second wafer 2000 includes second chips 200 arranged in an array. The second chip 200 includes a second substrate 202, a second cover layer 204 of a third dielectric material on a front surface of the second substrate 202, a second capacitor plate 214 and a second plate interconnection structure 230 electrically connected to the second capacitor plate 214 that are arranged in the second cover layer 204, and a second bonding layer 220 of a fourth dielectric material on the second cover layer 204, as shown in FIG. 6.

In the embodiment, all the device processing processes before forming a bonding layer are performed on the second wafer 2000. As shown in FIG. 6, a second device structure 210, a second device interconnection structure 212 of the second device structure 210, a second capacitor plate 214 and a second plate interconnection structure 230 of the second capacitor plate 214 are already formed on the second substrate 202 of the second wafer 2000, which are covered by the second cover layer 204 of the third dielectric material. The second device interconnection structure 212 and the second plate interconnection structure 230 may or may not be electrically connected with each other. The second plate interconnection structure 230 may be formed together with the second device interconnection structure 212, and may have partially or completely the same structure as the second device interconnection structure 212. The second capacitor plate 214 may be formed together with a top wiring layer in the second device interconnection structure 212, such that no interconnection structure is formed on the second capacitor plate 214. In this example, the second capacitor plate 214 may be arranged in a top wiring layer, and is formed together with the top wiring layer of the second device interconnection structure 212.

The second bonding layer 220 of the dielectric material on the second cover layer 204 is used for bonding between the wafers. According to actual needs, a second bonding pad 222 may be formed in the second bonding layer 220, to electrically connect to the top wiring layer. Further, the second bonding layer 222 may be aligned with a bonding pad in another wafer, to form a wafer structure in a hybrid bonding manner.

Figure 7:
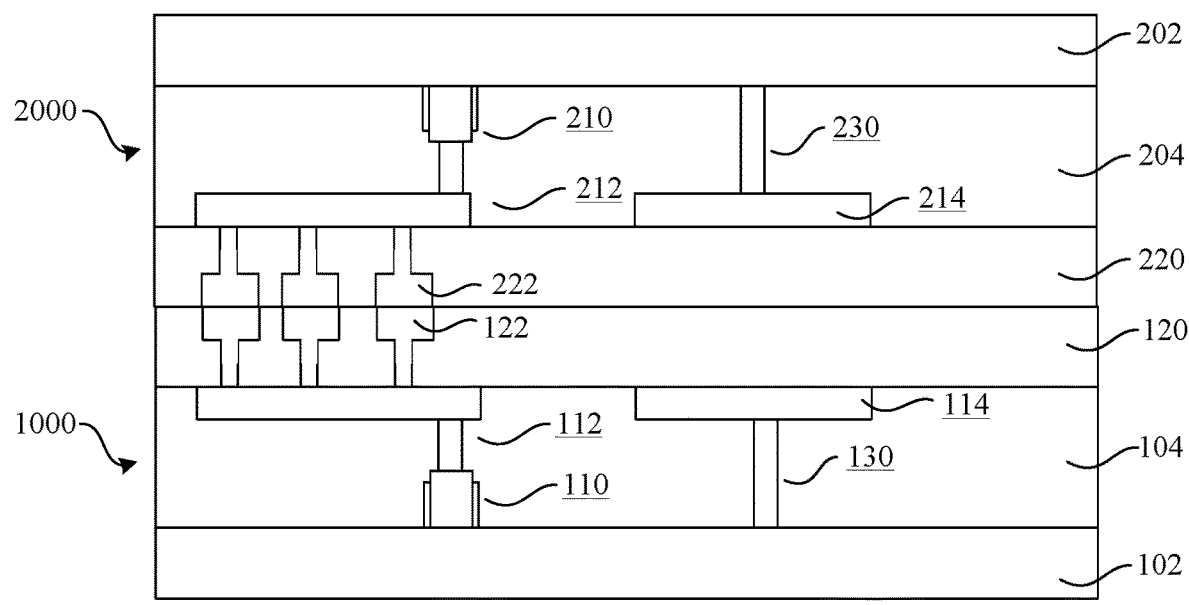

In step S03, the first wafer 1000 and the second wafer 2000 are bonded together via the first bonding layer 120 and the second bonding layer 220, to obtain a wafer bonding structure in which the first wafer 1000 is stacked with the second wafer 2000 with a front surface of the first wafer 1000 facing toward a front surface of the second wafer 2000. The first capacitor plate 114 is arranged facing toward the second capacitor plate 214 with at least at least the second dielectric material and the fourth dielectric material being provided between the first capacitor plate 114 and the second capacitor plate 214, as shown in FIG. 7.

In a specific embodiment, the second bonding layer 220 of the second wafer 2000 may be arranged toward the first bonding layer 120 of the first wafer 1000, and the two wafers are aligned. Then the first wafer 100 and the second wafer 200 are bonded together by a bonding apparatus, and a bonding interface of the two wafers is formed between the first bonding layer 120 and the second bonding layer 220. In some applications, only the first bonding layer 120 and the second bonding layer 220 are arranged, thus only a bonding interface of the dielectric material is formed after the bonding process. In other applications, a bonding pad may be formed in each of the bonding layers, thus a hybrid bonding interface including a dielectric material and a conductive material is formed.

After the bonding process, a capacitor structure is formed by the first capacitor plate 114, the second capacitor plate 214 arranged facing toward the first capacitor plate 114, and the dielectric materials between the capacitor plate 114 and the second capacitor plate 214.

Further, other necessary processing processes may be performed, such as a thinning process performed at a back surface of the first wafer or the second wafer, and a further interconnection process, such as a wiring process, a silicon via hole process, and/or a leading-out substrate formation process.

Thus, the wafer structure according to the embodiment of the present disclosure is formed. Next, as shown in FIG. 4, the wafer bonding structure may be cut along cutting trenches, to obtaining separate chip structures.

The embodiments in this specification are described in a progressive way, each of which emphasizes the differences from others, and the same or similar parts among the embodiments can be referred to each other. Since the structure disclosed in the embodiments corresponds to the method therein, the description thereof is relatively simple, and for relevant parts references may be made to the description of the method.

The above are only preferred embodiments of the present disclosure. Although the present disclosure has been disclosed in the above with the preferred embodiments, the present disclosure is not limited thereto. Numerous alternations, modifications, and equivalents can be made to the technical solution of the present disclosure by those skilled in the art according to the methods and technical content disclosed herein without deviation from the scope of the technical solution of the present disclosure. Therefore, the alternations, modifications, and equivalents made to the technical solution of the present disclosure according to the technical essences of the present disclosure without departing from the technical solutions of the present disclosure should fall within the protection scope of the present disclosure.

The invention claimed is:

1. A chip structure, comprising:
   a first chip, wherein the first chip comprises a first substrate, a first cover layer of a first dielectric material on a front surface of the first substrate, a first capacitor plate and a first plate interconnection structure electrically connected to the first capacitor plate that are arranged in the first cover layer, and a first bonding layer of a second dielectric material on the first cover layer; and a second chip, wherein the second chip comprises a second substrate, a second cover layer of a third dielectric material on a front surface of the second substrate, a second capacitor plate and a second plate interconnection structure electrically connected to the second capacitor plate that are arranged in the second cover layer, and a second bonding layer of a fourth dielectric material on the second cover layer, wherein the first chip is stacked with the second chip via the first bonding layer and the second bonding layer with a front surface of the first chip facing toward a front surface of the second chip, and the first capacitor plate is arranged facing toward the second capacitor plate with at least the second dielectric material and the fourth dielectric material being provided between the first capacitor plate and the second capacitor plate;

wherein the first plate interconnection structure comprises an interconnection layer connected to the first capacitor plate; and wherein the first bonding layer is arranged with a bonding pad to lead out the interconnection layer of the first device interconnection structure, and the second bonding layer is arranged with a bonding pad to lead out an interconnection layer of the second device interconnection structure, and wherein the bonding pad of the first bonding layer is aligned with the bonding pad of the second bonding pad.

2. The chip structure according to the claim 1, wherein the first capacitor plate is arranged in a top wiring layer in the first chip, and the second capacitor plate is arranged in a top wiring layer in the second chip.

3. The chip structure according to the claim 1, wherein the first plate interconnection structure comprises a first contact plug on the first substrate, and the first contact plug is connected to the first capacitor plate.

4. The chip structure according to the claim 1, wherein the second plate interconnection structure comprises a second contact plug on the second substrate, and the second contact plug is connected to the second capacitor plate.

5. The chip structure according to the claim 1, wherein the first capacitor plate is arranged in a wiring layer other than a top wiring layer in the first chip, and the second capacitor plate is arranged in a wiring layer other than a top wiring layer in the second chip.

6. A wafer structure, comprising a wafer bonding structure, wherein the wafer bonding structure comprises a first wafer and a second wafer that are stacked with each other with a front surface of the first wafer facing toward a front surface of the second wafer, and the wafer bonding structure further comprises a plurality of chip structures arranged in an array, wherein each of the chip structures comprises:
a first chip, wherein the first chip comprises a first substrate, a first cover layer of a first dielectric material on a front surface of the first substrate, a first capacitor plate and a first plate interconnection structure electrically connected to the first capacitor plate that are arranged in the first cover layer, and a first bonding layer of a second dielectric material on the first cover layer; and a second chip, wherein the second chip comprises a second substrate, a second cover layer of a third dielectric material on a front surface of the second substrate, a second capacitor plate and a second plate interconnection structure electrically connected to the second capacitor plate that are arranged in the second cover layer, and a second bonding layer of a fourth dielectric material on the second cover layer;

wherein the first chip is stacked with the second chip via the first bonding layer and the second bonding layer with a front surface of the first chip facing toward a front surface of the second chip, and the first capacitor plate is arranged facing toward the second capacitor plate with at least the second dielectric material and the fourth dielectric material being provided between the first capacitor plate and the second capacitor plate;

wherein the first plate interconnection structure comprises an interconnection layer connected to the first capacitor plate; and wherein the first bonding layer is arranged with a bonding pad to lead out the interconnection layer of the first device interconnection structure, and the second bonding layer is arranged with a bonding pad to lead out an interconnection layer of the second device interconnection structure, and wherein the bonding pad of the first bonding layer is aligned with the bonding pad of the second bonding pad.

7. The wafer structure according to claim 6, wherein the first capacitor plate is arranged in a top wiring layer in the first chip, and the second capacitor plate is arranged in a top wiring layer in the second chip.

8. The wafer structure according to claim 6, wherein
the first plate interconnection structure comprises a first contact plug on the first substrate, and the first contact plug is connected to the first capacitor plate.

9. The wafer structure according to claim 5, wherein
the second plate interconnection structure comprises a second contact plug on the second substrate, and the second contact plug is connected to the second capacitor plate.

10. The wafer structure according to the claim 6, wherein the first capacitor plate is arranged in a wiring layer other than a top wiring layer in the first chip, and the second capacitor plate is arranged in a wiring layer other than a top wiring layer in the second chip.

11. A method for manufacturing a wafer structure, comprising:
providing a first wafer, wherein the first wafer is provided with first chips arranged in an array, and each of the first chips comprises a first substrate, a first cover layer of a first dielectric material on a front surface of the first substrate, a first capacitor plate and a first plate interconnection structure electrically connected to the first capacitor plate that are arranged in the first cover layer, and a first bonding layer of a second dielectric material on the first cover layer;

providing a second wafer, wherein the second wafer is provided with second chips arranged in an array, and each of the second chips comprises a second substrate, a second cover layer of a third dielectric material on a front surface of the second substrate, a second capacitor plate and a second plate interconnection structure electrically connected to the second capacitor plate that are arranged in the second cover layer, and a second bonding layer of a fourth dielectric material on the second cover layer; and bonding the first wafer and the second wafer together via the first bonding layer and the second bonding layer, to obtain a wafer bonding structure in which the first wafer is stacked with the second wafer with a front surface of the first wafer facing toward a front surface of the second wafer, wherein the first capacitor plate is arranged facing toward the second capacitor plate with at least the second dielectric material and the fourth dielectric material being provided between the first capacitor plate and the second capacitor plate;

wherein the first plate interconnection structure comprises an interconnection layer connected to the first capacitor plate; and wherein the first bonding layer is arranged with a bonding pad to lead out the interconnection layer of the first device interconnection structure, and the second bonding layer is arranged with a bonding pad to lead out an interconnection layer of the second device interconnection structure, and wherein the bonding pad of the first bonding layer is aligned with the bonding pad of the second bonding pad.

12. The method for manufacturing a wafer structure according to claim 11, wherein the first capacitor plate is arranged in a top wiring layer in the first chip, and the second capacitor plate is arranged in a top wiring layer in the second chip.

13. The method for manufacturing a wafer structure according to claim 11, further comprising:
cutting the wafer bonding structure, to obtain separate chip structures.

14. The method for manufacturing a wafer structure according to claim 11, wherein the first capacitor plate is arranged in a wiring layer other than a top wiring layer in the first chip, and the second capacitor plate is arranged in a wiring layer other than a top wiring layer in the second chip.

* * * * *